United States Patent
Tanaka (10) Patent No.: US 8,757,059 B2
(45) Date of Patent: Jun. 24, 2014

(54) SCREEN PRINTING APPARATUS AND SCREEN PRINTING METHOD

(75) Inventor: Tetsuya Tanaka, Yamanashi (JP)

(73) Assignee: Panasonic Corporation, Osaka (JP)

( * ) Notice: Subject to any disclaimer, the term of this patent is extended or adjusted under 35 U.S.C. 154(b) by 168 days.

(21) Appl. No.: 13/201,898

(22) PCT Filed: Jun. 22, 2010

(86) PCT No.: PCT/JP2010/004153
§ 371 (c)(1),
(2), (4) Date: Aug. 17, 2011

(87) PCT Pub. No.: WO2011/007502
PCT Pub. Date: Jan. 20, 2011

(65) Prior Publication Data
US 2011/0297019 A1 Dec. 8, 2011

(30) Foreign Application Priority Data
Jul. 13, 2009 (JP) ................. 2009-164744

(51) Int. Cl.
*B41F 15/00* (2006.01)
*B41F 15/42* (2006.01)
*B41F 15/44* (2006.01)
*B41F 15/46* (2006.01)

(52) U.S. Cl.
USPC ............ 101/129; 101/114; 101/123

(58) Field of Classification Search
USPC .......... 101/114, 123, 127, 129, 124; 118/213, 118/241, 242, 406; 427/282
IPC ................... B41F 15/42,15/44, 15/46
See application file for complete search history.

(56) References Cited

U.S. PATENT DOCUMENTS 6,553,905 B2 * 4/2003 Miyahara et al. ........... 101/129

6,591,745 B2 * 7/2003 Miyahara et al. ........... 101/123
(Continued)

FOREIGN PATENT DOCUMENTS

| GB | 2480725 A | 11/2011 |
| GB | 2482573 A | 2/2012 |

(Continued)

OTHER PUBLICATIONS

International Search Report for PCT/JP2010/004153 dated Aug. 17, 2010.

*Primary Examiner* — Leslie J Evanisko
*Assistant Examiner* — Marissa Ferguson Samreth
(74) *Attorney, Agent, or Firm* — Pearne & Gordon LLP (57) ABSTRACT

In screen printing on such printing targets as an upper surface of a substrate and a bottom surface of a recess portion which is opened to the upper surface, there are provided a screen printing apparatus and a screen printing method by which printing work can be executed with good efficiency while ensuring a good printing quality.

In screen printing a paste on such printing targets as an upper surface printing area on which upper electrodes are formed and a bottom surface printing area which is set on a bottom surface of a recess portion and on which bottom surface electrodes are formed by a closed type squeegee mechanism 13 which includes a first sliding contact plate 44A and a second sliding contact plate 44B, when screen printing the paste on a bottom surface printing region 12a as a printing target, the paste remaining in a depressed portion is scooped up to be removed therefrom by the first sliding contact plate 44A which is positioned at a rear side in a squeegeeing direction, while when screen printing the paste on an upper surface printing region 12b as a printing target, the paste sticking to an upper surface is scraped off by the second sliding contact plate 44B which is positioned at a rear side in a squeegeeing direction.

4 Claims, 8 Drawing Sheets

(56) References Cited

U.S. PATENT DOCUMENTS

| | | | |
|---|---|---|---|
| 6,615,715 B2 * | 9/2003 | Abe et al. | 101/129 |
| 6,755,127 B2 * | 6/2004 | Miyahara et al. | 101/129 |
| 6,997,107 B2 * | 2/2006 | Abe et al. | 101/123 |
| 7,070,654 B2 * | 7/2006 | Miyahara et al. | 118/302 |
| 7,802,516 B2 * | 9/2010 | Kobayashi | 101/129 |

FOREIGN PATENT DOCUMENTS

| | | | | |
|---|---|---|---|---|
| GB | 2483545 A | | 3/2012 | |
| JP | 61-164895 A | | 7/1986 | |
| JP | 62-146627 | * | 6/1987 | B41F 15/08 |
| JP | 05-13740 U | | 2/1993 | |
| JP | 05-147190 A | | 6/1993 | |
| JP | 05-212852 A | | 8/1993 | |
| JP | 07-156363 A | | 6/1995 | |
| JP | 07-186361 A | | 7/1995 | |
| JP | 2000-141599 A | | 5/2000 | |
| JP | 2000-168040 A | | 6/2000 | |
| JP | 2001-504049 A | | 3/2001 | |
| JP | 2001-291952 A | | 10/2001 | |
| JP | 2001-326135 A | | 11/2001 | |
| JP | 2002-001905 A | | 1/2002 | |
| JP | 2003-048303 | * | 2/2003 | B41F 15/40 |
| JP | 2004-136509 A | | 5/2004 | |
| JP | 2007-144914 | * | 11/2005 | B41F 15/44 |
| JP | 2005-343116 | * | 12/2005 | B41F 15/44 |
| JP | 2006-167992 | * | 6/2006 | B41F 15/42 |
| JP | 2006-269555 A | | 10/2006 | |
| JP | 2008-235761 A | | 10/2008 | |
| JP | 2009-70867 A | | 4/2009 | |

* cited by examiner

SCREEN PRINTING APPARATUS AND SCREEN PRINTING METHOD

TECHNICAL FIELD

The present invention relates to a screen printing apparatus and a screen printing method for printing an electronic part joining paste on such printing targets as an upper surface of a substrate and bottom surfaces of recess portions which are opened to the upper surface of the substrate.

BACKGROUND ART

In an electronic parts packaging line for fabricating package substrates in which electronic parts are mounted on a substrate, a screen printing apparatus for printing an electronic part joining paste on a substrate is connected to an upstream side of an electronic parts installation apparatus which installs electronic parts such as semiconductors on a substrate. As one of types of substrates on which electronic parts are packaged, there is conventionally known a cavity substrate in which electrode patterns are formed on both an upper surface of the substrate and bottom surfaces of recess portions which are opened to the upper surface of the substrate, and such cavity substrates have been in use in various equipment as a light, highly dense substrate (Patent Document 1). In a screen printing for printing an electronic part joining paste on a cavity substrate like this as a printing target, a screen mask is used which has a flat plate portion which is brought into contact with an upper surface of a substrate and fitting portions which are formed so as to project downwards from the flat plate portion to fit in the recess portions. By employing a three-dimensional screen mask like this, the paste can be printed both on the upper surface of the substrate and the bottom surfaces of the recess portions simultaneously.

RELATED ART DOCUMENT

Patent Document

Patent Document 1: JP-A-2008-235761

SUMMARY OF THE INVENTION

Problem that the Invention is to Solve

In the screen printing on such a printing target as the cavity substrate described above, there exist various limitations and problems attributed to the use of the three-dimensional screen mask and it has been difficult to execute printing work with good efficiency while ensuring a good printing quality. For example, although paste needs to be filled properly in patterned holes provided in the screen mask in order to print the paste on a substrate without generating the spread or lack thereof, filling conditions of paste in the patterned holes provided in the flat plate portion differ essentially from filling conditions of paste in the patterned holes provided in the fitting portion. Thus, in the same screen printing mechanism, it is difficult to ensure a good printing quality both at the flat plate portion and the fitting portion. Because of this, measures have been desired for executing printing work on a cavity substrate with good efficiency while ensuring a good printing quality.

Then, in screen printing on such printing targets as an upper surface of a substrate and bottom surfaces of recess portions which are opened to the upper surface thereof, an object of the invention is to provide a screen printing apparatus and a screen printing method for executing printing work with good efficiency while ensuring a good printing quality.

Means for Solving the Problem

A screen printing apparatus of the invention is a screen printing apparatus for printing an electronic part joining paste on printing targets as an upper surface printing area which is set on an upper surface of a substrate and on which upper surface electrodes are formed and a bottom surface printing area which is set on a bottom surface of a recess portion which is opened to the upper surface and on which bottom surface electrodes are formed, the screen printing apparatus comprising a screen mask including a bottom surface printing region which has a fitting portion which is provided so as to correspond to the bottom surface printing area and which fits in the recess portion and patterned holes which are formed in the fitting portion so as to correspond to the bottom electrodes and an upper surface printing region which is provided so as to correspond to the upper surface printing area and patterned holes which are formed so as to correspond to the upper surface electrodes, a substrate positioning unit which holds a substrate which is transferred from an upstream side and selectively registers the substrate with either the bottom surface printing region or the upper surface printing region, and a closed type squeegee mechanism which has a pair of facing sliding contact plates which extend downwards from a lower surface side of a main body portion which stores the paste so as to gradually narrow a distance between the facing sliding contact plates as the facing sliding contact plates extend downwards with their facing direction aligned with a squeegeeing direction and which is adapted to slide in a squeegeeing direction with the sliding contact plates brought into abutment with either the bottom surface printing region or an upper surface of the upper surface printing region while pressurizing the paste stored in the main body portion so that the paste is supplied into the fitting portion or is filled in the patterned holes via a printing opening provided between the sliding contact plates, and wherein, among the pair of sliding contact plates of the closed type squeegee mechanism, a first sliding contact plate which is positioned at a rear side in a squeegeeing direction in a squeegeeing operation on the bottom surface printing region as a printing target scoops up the paste which remains in an upper surface side depressed portion of the fitting portion so as to remove it from the depressed portion in the squeegeeing operation, while a second sliding contact plate which is positioned at a rear side in a squeegeeing direction in a squeegeeing operation on the upper surface printing region as a printing target scrapes off the paste sticking to the upper surface of an upper surface of the upper surface printing mask in the squeegeeing operation.

A screen printing method for printing an electronic part joining paste on such printing targets as an upper surface printing area which is set on an upper surface of a substrate and on which upper surface electrodes are formed and a bottom surface printing area which is set on a bottom surface of a recess portion which is opened to the upper surface and on which bottom surface electrodes are formed, characterized by employing a screen printing apparatus comprising a screen mask including a bottom surface printing region which has a fitting portion which is provided so as to correspond to the bottom surface printing area and which fits in the recess portion and patterned holes which are formed in the fitting portion so as to correspond to the bottom electrodes and an upper surface printing region which is provided so as to correspond to the upper surface printing area and patterned holes which are formed so as to correspond to the upper surface electrodes, a substrate positioning unit which holds a substrate which is transferred from an upstream side and selectively registers the substrate with either the bottom surface printing region or the upper surface printing region, and a closed type squeegee mechanism which has a pair of facing sliding contact plates which extend downwards from a lower surface side of a main body portion which stores the paste so as to gradually narrow a distance therebetween as they extend downwards with their facing direction aligned with a squeegeeing direction and which is adapted to slide in a squeegeeing direction with the sliding contact plates brought into abutment with either the bottom surface printing region or an upper surface of the upper surface printing region while pressurizing the paste stored in the main body portion so that the paste is supplied into the fitting portion or is filled in the patterned holes via a printing opening provided between the sliding contact plates, and characterized in that in a squeegeeing operation on the bottom surface printing region as a printing target, the paste which remains in an upper surface side depressed portion of the fitting portion is scooped up by a first sliding contact plate of the pair of sliding contact plates of the closed type squeegee mechanism which is positioned at a rear side in a squeegeeing direction in the squeegeeing operation so as to be removed from the depressed portion, while in a squeegeeing operation on the upper surface printing region as a printing target, the paste sticking to an upper surface of the upper surface printing mask is scraped off by a second sliding contact plate of the pair of sliding contact plates of the closed type squeegee mechanism which is positioned at a rear side in a squeegeeing direction in the squeegeeing operation.

Advantage of the Invention

According to the invention, in the screen printing of the electronic part joining paste on such printing targets as the upper surface printing area which is set on the upper surface of the substrate and on which the upper surface electrodes are formed and the bottom surface printing area which is set on the bottom surface of the recess portion which is opened to the upper surface and on which the bottom surface electrodes are formed by the same closed type squeegee mechanism, in the squeegeeing operation on the bottom surface printing region as the printing target, the paste which remains in the upper surface side depressed portion of the fitting portion is scooped up by the first sliding contact plate of the pair of sliding contact plates of the closed type squeegee mechanism which is positioned at the rear side in the squeegeeing direction in the squeegeeing operation so as to be removed from the depressed portion, while in the squeegeeing operation on the upper surface printing region as the printing target, the paste sticking to the upper surface of the upper surface of the upper surface printing mask is scraped off by the second sliding contact plate of the pair of sliding contact plates of the closed type squeegee mechanism which is positioned at the rear side in the squeegeeing direction in the squeegeeing operation, whereby the printing work can be executed with good efficiency while ensuring a good printing quality.

BRIEF DESCRIPTION OF THE DRAWINGS

FIGS. 3(a), (b) are explanatory diagrams of the configuration of a substrate which constitutes a printing target of the screen printing apparatus of the embodiment of the invention.

FIGS. 4(a), (b) are partial sectional views of a screen mask provided on the screen printing apparatus of the embodiment of the invention.

FIGS. 6 (a), (b) are explanatory diagrams of the operation of the screen printing apparatus of the embodiment of the invention.

FIGS. 7(a), (b), (c) are explanatory diagrams of the operation of the embodiment of the invention.

FIGS. 8 (a), (b) are explanatory diagrams of the operation of the screen printing apparatus of the embodiment of the invention.

MODE FOR CARRYING OUT THE INVENTION

Next, referring to the drawings, a screen printing apparatus 1 of an embodiment of the invention will be described. Firstly, referring to FIGS. 1, 2, an overall configuration of the screen printing apparatus 1 will be described. The screen printing apparatus 1 is designed to make a screen printing on such a printing target as a cavity substrate in which electrode patterns are formed on both an upper surface of the substrate and bottom surfaces of recess portions which are opened to the upper surface of the substrate and has as a function to screen print a paste on electrodes.

Figure 1:
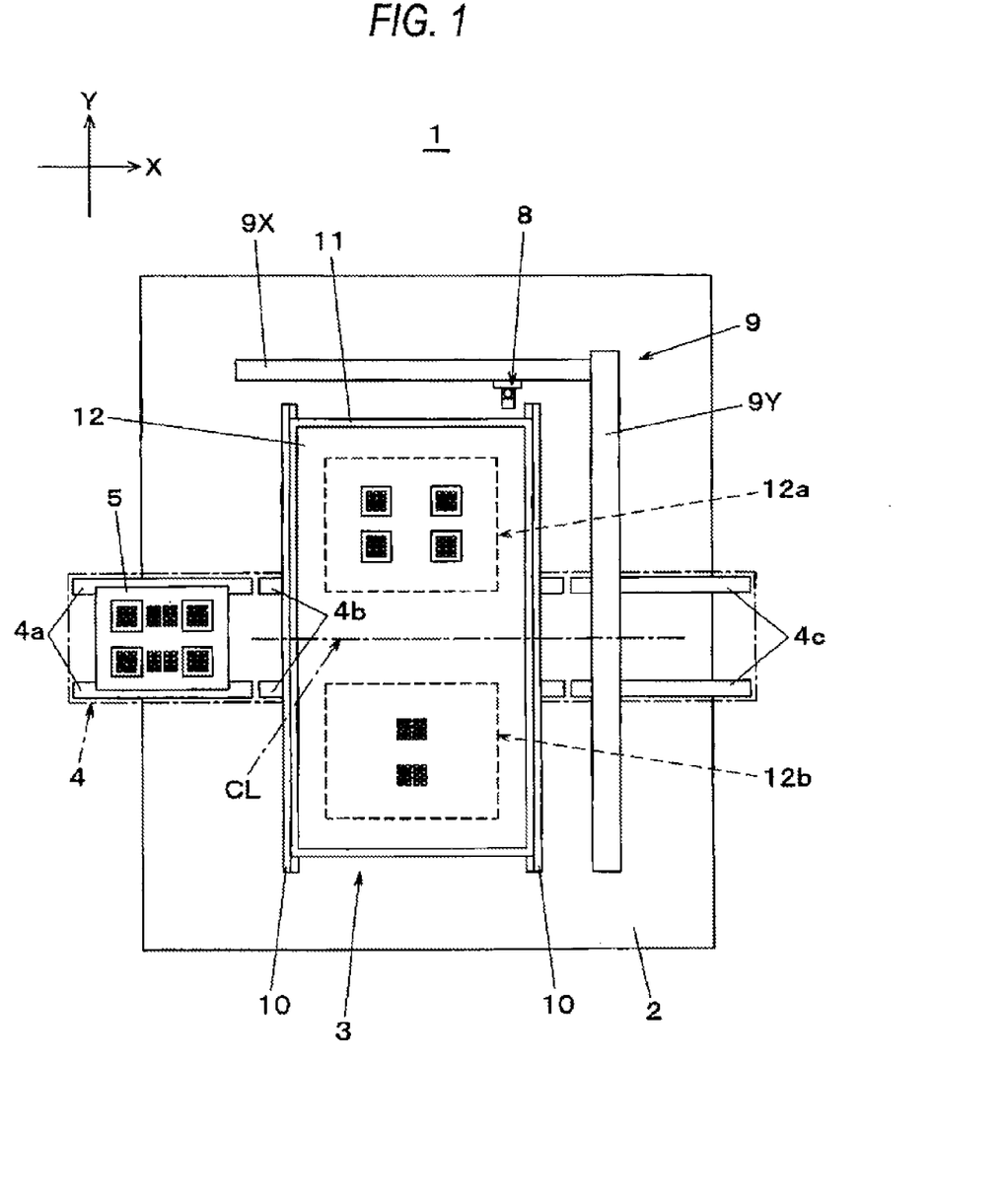
FIG. 1 is a partial plan view of a screen printing apparatus of an embodiment of the invention.
Figure 2:
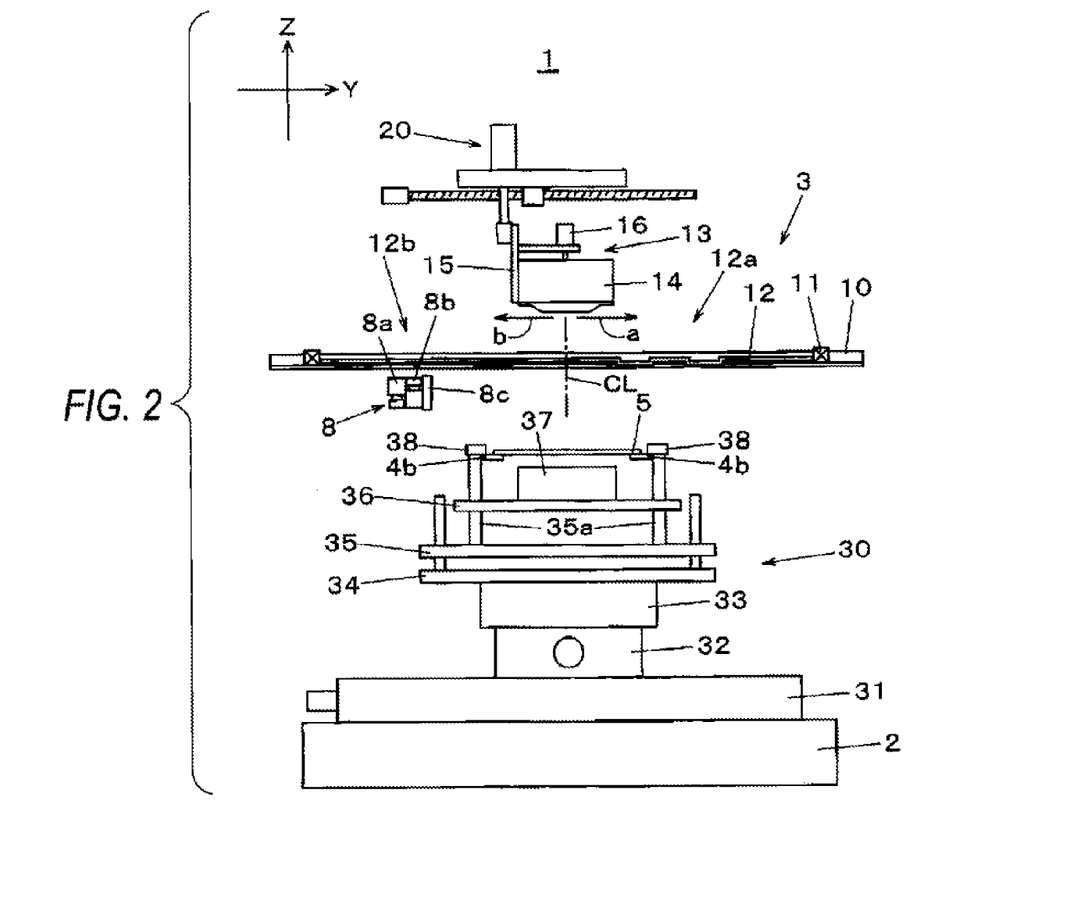
FIG. 2 is a sectional view of the screen printing apparatus of the embodiment of the invention.

In FIGS. 1, 2, the screen printing apparatus 1 is configured so that a screen printing unit 3 for executing screen printing is disposed at a central portion of a base 2 and a substrate transfer mechanism 4 for transferring a substrate 5 which constitutes a printing target to the screen printing unit 3 is placed to extend along an X direction. The substrate transfer mechanism 4 is made up of feed-in conveyors 4a, printing conveyors 4b and feed-out conveyors 4c. The feed-in conveyors 4a receive a substrate 5 which is fed in from an upstream side of the screen printing apparatus 1 and transfers the substrate 5 to the printing conveyors 4b. The printing conveyors 4b transfer the substrate 5 so transferred thereto to a printing position where printing is carried out by the screen printing unit 3. The feed-out conveyors 4c is given the substrate 5 on which printing work by the screen printing unit 3 has been completed by the printing conveyors 4b and transfer the substrate 5 to a downstream side of the screen printing apparatus 1.

In FIG. 2, a substrate positioning unit 30 having a function to hold the substrate 5 to position it in the printing position is placed on an upper surface of the base 2. The substrate positioning unit 30 is configured so that a Y-axis table 31, an X-axis table 32 and a θ-axis table 33 are stacked one on another and a first elevating plate 35 and further, a second elevating plate 36 are superposed above a base plate 34 which is fixed to the θ-axis table 33. The base plate 34 moves in an X direction, a Y direction and θ direction by driving the Y-axis table 31, the X-axis table 32 and the θ-axis table 33. The first elevation plate 35 and the second elevation plate 36 each include its own elevation driving mechanism. The first elevation plate 35 is elevated up and down relative to the base plate 34, while the second elevation plate 36 is elevated up and down relative to the first elevation plate 35. Clamp members 38 are placed at upper end portions of elevation shafts 35a which are elevated up and down together with the first elevation plate 35 so as to clamp the substrate 5 from both sides thereof in the Y direction above the printing conveyor 4b and the printing conveyor 4b which make up the substrate transfer mechanism 4.

A lower support member 37 is secured to an upper surface of the second elevation plate 36. By elevating the second elevation plate 36, the lower support member 37 is brought into abutment with a lower surface side of the substrate 5 which has been transferred by the printing conveyors 4b to thereby hold the substrate 5 in a printing height position. The substrate 5 is held by so as to be fixed in place between the clamp members 38 in this state. By elevating the first elevation plate 25 in this state, the substrate 5, which constitutes a printing target, is brought into abutment with a screen mask 12, which will be described below, from a lower surface side thereof. As this occurs, by driving the substrate positioning unit 30, the substrate 5, which constitutes a printing target, can be registered with the screen mask 12 in the X, Y and θ directions.

The screen mask 12, which makes up the screen printing unit 3, is disposed in a horizontal posture above the substrate positioning unit 30. The screen mask 12 is stretched across a square mask frame 11, and the mask frame 11 is held by a pair mask holders 10 which are disposed so as to face each other in the X direction. In this embodiment, two printing regions are set on the screen mask 12. As is shown in FIG. 1, in the screen mask 12, a bottom surface printing region 12a is formed on one side (an upper side in FIG. 1) of a center line CL and an upper surface printing region 12b is formed on the other side (a lower side in FIG. 1) of the center line CL.

Figure 3:
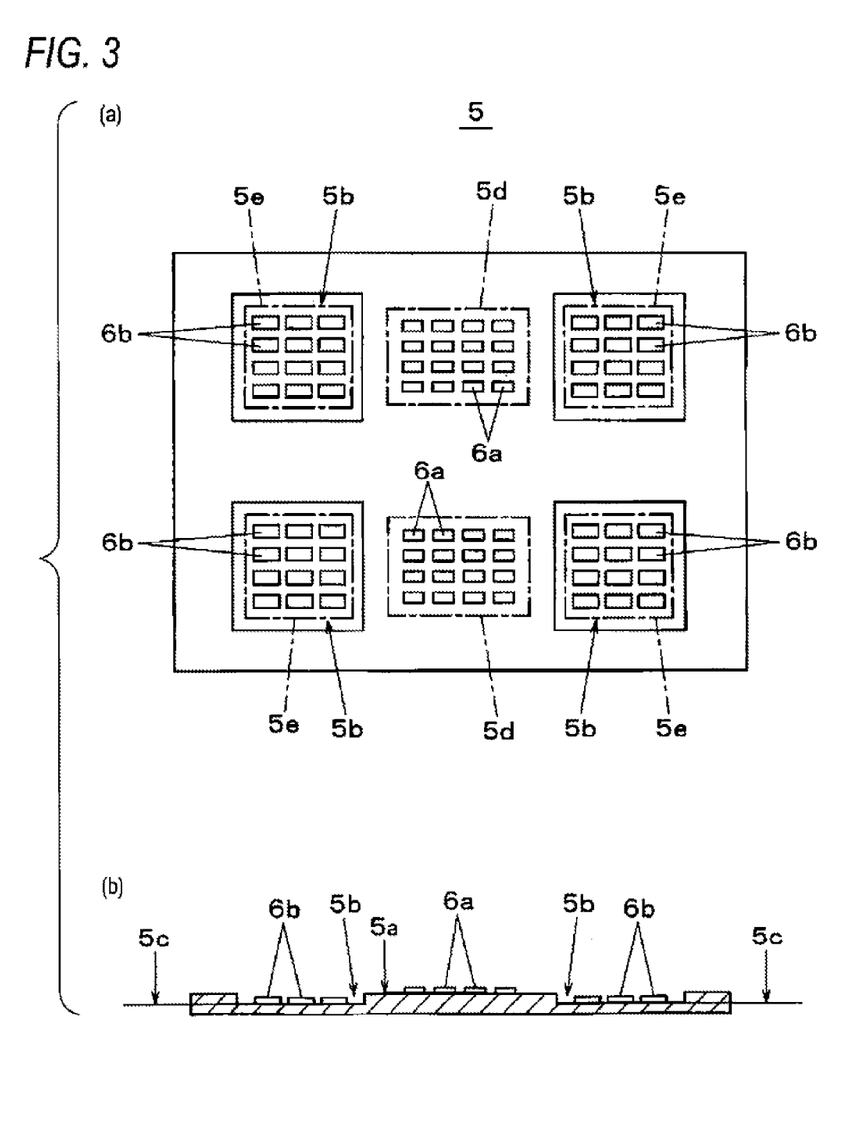

Here, the substrate 5, which constitutes a printing target of the screen printing apparatus 1, and a relationship between the substrate 5 and the aforesaid printing regions will be described by reference to FIGS. 3(a), (b) and 4(a). In this embodiment, the substrate 5 takes a form in which the substrate 5 has two types of printing surfaces whose heights are different. Namely, as is shown in FIG. 3, a plurality of (two in this embodiment) upper surface printing areas 5d on each of which a plurality of upper surface electrodes 6a are formed are set on an upper surface 5a of a central portion of the substrate 5. Further, a recess portion 5b having a bottom surface 5c whose height position is lower than that of the upper surface 5a is formed in the vicinity of each corner portion of the substrate 5, and a plurality of bottom surface electrodes 6b are formed on a bottom surface printing area 5e which is set on the bottom surface 5c. The screen printing apparatus 1 illustrated in this embodiment prints an electronic part joining paste individually on the bottom surface printing area 5e set within the recess portion 5b and the upper surface printing area 5d set on the upper surface 5a.

Figure 4:
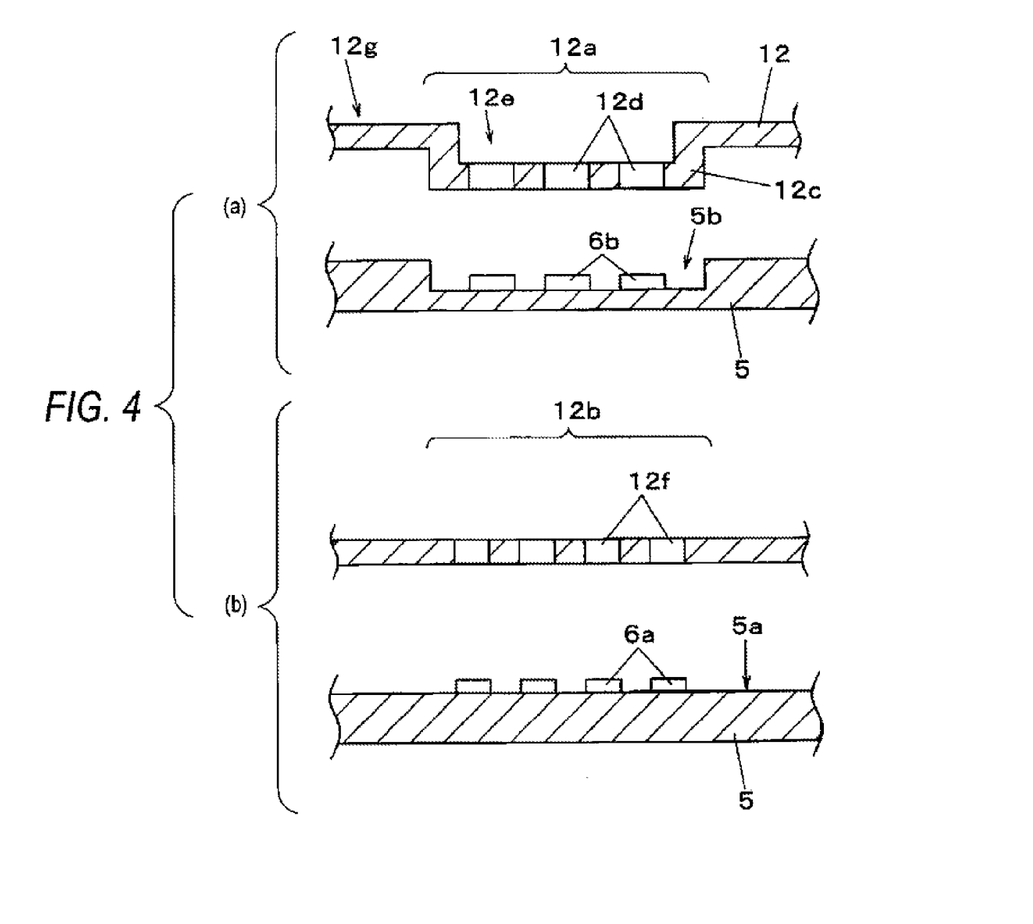

In the screen mask 12, a mask pattern which corresponds to the bottom surface printing areas 5e is provided on the bottom surface printing region 12a, and a mask pattern which corresponds to the upper surface printing areas 5d is provided on the upper surface printing region 12b. Namely, as is shown in FIG. 4(a), fitting portions 12c each having a shape which enables the fitting portion 12c to fit in the corresponding recess portion 5b are provided on the bottom surface printing region 12a so as to project from the screen mask 12 to a lower surface side thereof in such a way as to correspond to the arrangement of the recess portions 5b on the substrate 5. An upper surface of each fitting portion 12c is depressed from the screen mask 12 into a depressed portion 12e. Patterned holes 12d are formed in an interior of the depressed portion 12e so as to correspond to an arrangement of bottom surface electrodes 6b within the recess portion 5b. In addition, as is shown in FIG. 4(b), patterned holes 12f are formed in the upper surface printing region 12b so as to correspond to an arrangement of upper surface electrodes 6a on the upper surface 5a of the substrate 5.

Namely, in this embodiment, the mask screen 12 includes the bottom surface printing region 12a which has the fitting portions 12c which are provided so as to correspond to the bottom surface printing areas 5e and which fit in the recess portions 5b and the patterned holes 12d which are formed in the fitting portions 12c so as to correspond to the bottom electrodes 6b and the upper surface printing region 12b which is provided so as to correspond to the upper surface printing areas 5d and which has the patterned holes 12f which are formed so as to correspond to the upper surface electrodes 6a. The substrate 5 which is transferred from the upstream side and is held by the substrate positioning unit 30 is selectively registered with either the bottom surface printing region 12a of the upper surface printing region 12b by driving the substrate positioning unit A camera moving mechanism 9 made up of a camera X axis table 9X and a camera Y axis table 9Y is placed on the upper surface of the base 2 in a position which lies to a side of the screen mask 12. A camera unit 8 is installed on the camera X axis table 9X, and the camera unit 8 moves in the X direction and Y direction by driving the camera moving mechanism 9. As is shown in FIG. 2, the camera unit 8 includes two cameras; a substrate recognition camera 8a and a mask recognition camera 8b whose image capturing directions are downwards and upwards, respectively. By positioning the substrate recognition camera 8a and the mask recognition camera 8b being positioned above the substrate 5 held by the substrate positioning unit 30, an image of a recognition mark formed on the substrate 5 can be captured by the substrate recognition camera 8a, and the position of the substrate 5 is detected by recognition processing the results of the image capturing operation. In addition, by positioning the mask recognition camera 8b below recognition marks provided individually on the bottom surface printing region 12a and the upper surface printing region 12b, images of these recognition marks can be captured, and the positions of the bottom surface printing region 12a and the upper surface printing region 12b are detected by recognition processing the results of the image capturing operations.

A closed type squeegee mechanism 13, which is a squeegee unit, is placed above the screen mask 12 so as to be moved freely by a squeegee moving mechanism 20. The closed type squeegee mechanism 13 includes a printing unit 14 which is held by a connecting member 15, and a paste P stored in an interior of the printing unit 14 is pressurized by a cylinder 16 so as to be filled in the depressed portion 12e in the fitting portion 12c or the pattern holes 12f of the screen mask 12. In the case of the bottom surface printing region 12a and the upper surface printing region 12b constituting printing targets, as is shown in FIG. 2, the closed type squeegee mechanism 13 is moved from the center line CL in directions indicated by an arrow a and an arrow b, respectively.

Figure 5:
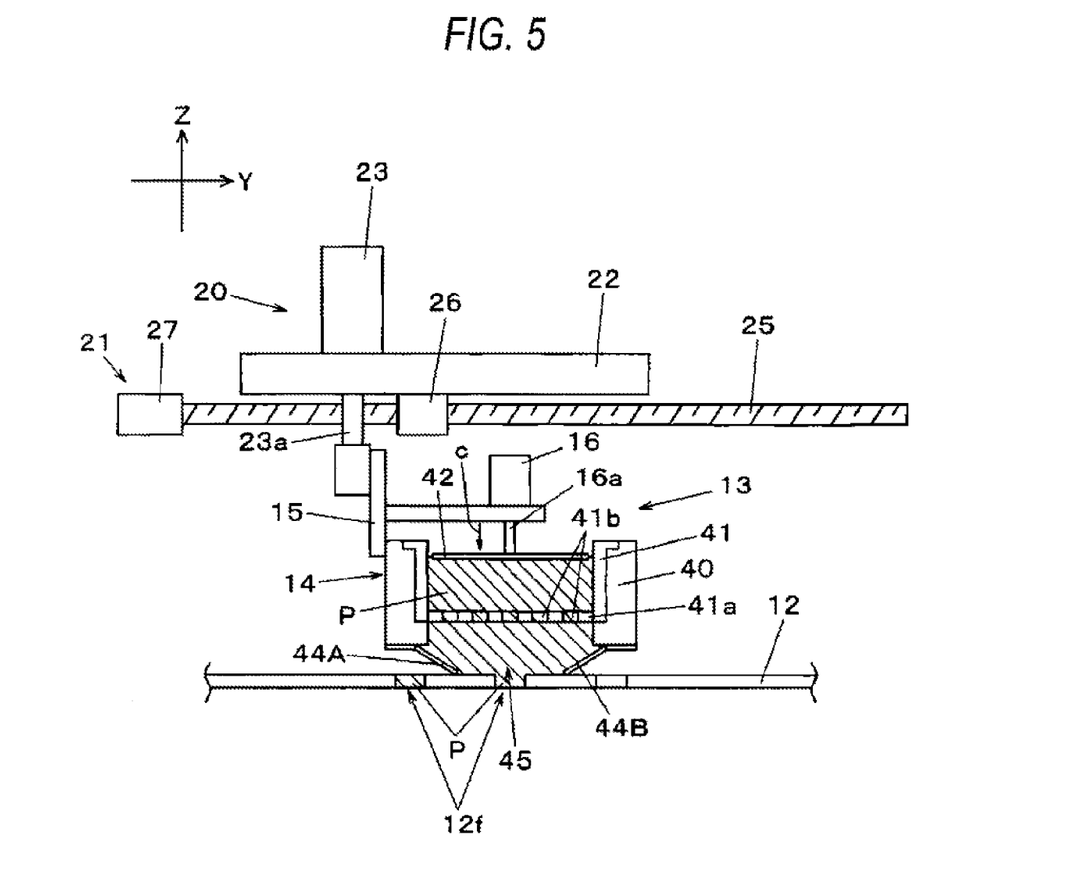
FIG. 5 is an explanatory diagram of the configuration of a closed type squeegee mechanism used in the screen printing apparatus of the embodiment of the invention.

Next, referring to FIG. 5, the configurations of the closed type squeegee mechanism 13 and the squeegee moving mechanism 20 will be described. The squeegee moving mechanism 20 includes a Y axis moving mechanism 21 for moving a moving plate 22 in the Y direction (in the direction of a squeegeeing operation) and a squeegee elevation mechanism 23 which is provided on an upper surface of the moving plate 22. The squeegee elevation mechanism 23 includes an air cylinder, and the closed type squeegee mechanism 13 is connected to a lower end portion of an elevation shaft 23a which extends downwards from the squeegee elevation mechanism 23 via a connecting member 15. By driving the squeegee elevation mechanism 23, the closed type squeegee mechanism 13 is elevated up and down relative to the screen mask 12 and the closed type squeegee mechanism 13 can be pressed against the screen mask 12 with a specified impression pressure.

The configuration of the Y axis moving mechanism 21 will be described. A nut member 26 is connected to a lower surface of the moving plate 22, and a feed screw 25 which is threaded through the nut member 26 is driven to rotate by a motor 27. The moving plate 22 moves horizontally by driving the motor 27, and hence, the closed type squeegee mechanism 13 which is connected to the squeegee elevation mechanism 23 also moves horizontally. The closed type squeegee mechanism 13 moves horizontally on the screen mask 12 by driving the motor 27 in such a state that the closed type squeegee mechanism 13 is elevated down or lowered. Namely, the motor 27, the feed screw 25 and the nut member 26 make up the Y axis moving mechanism 21 which moves the closed type squeegee mechanism 13 horizontally on the screen mask 12.

The printing unit 14 is provided at a lower portion of the closed type squeegee mechanism 13 which is adapted to be brought into abutment with a surface of the screen mask 12 so as fill the paste P in the patterned holes. A main body portion 40, which makes up the printing unit 14, is a block-like member which is elongated in a width direction of the screen mask 12. A lengthwise dimension of the main body portion 40 is set to cover a widthwise dimension of the substrate 5, which constitutes a printing target. A cartridge 41 which stores the paste P therein is detachably installed in the main body portion 40.

A predetermined amount of paste P is stored in the cartridge 41 in advance, and a pressurizing plate 42 for pressurizing the paste P in an interior of the cartridge 41 fits in an opening in an upper surface of the cartridge 41. The pressurizing plate 42 is connected to a rod 16a of the cylinder 16 which is disposed thereabove, and the pressurizing plate 42 moves upwards or downwards within the cartridge 41 by driving the cylinder 16. The paste P within the cartridge 41 is pressed down with a predetermined pressure by the pressurizing plate 42 by driving the cylinder 16 with a predetermined pressure (an arrow c).

A bottom surface of the cartridge 41 constitutes a screen plate 41a through which the paste P is forcibly passed, and a number of openings 41b are provided in the screen plate 41a. By pressing the pressurizing plate 42 downwards by the cylinder 16, the paste P within the cartridge 41 is pressurized and is forcibly passed through the openings 41b in the screen plate 41a while being squeezed so as to be pushed out downwards. By the paste P being squeezed in the way described above, the viscosity of the paste P is decreased so that the paste P is modified to have properties which are suitable for screen printing.

A pair of facing sliding contact plates (a first sliding contact plate 44A, a second sliding contact plate 44B) extend obliquely downwards and inwards from a lower surface side of the main body portion 40 in such a way as to narrow a distance between the facing sliding contact plates with their facing direction aligned with the squeegeeing direction (in the Y direction). The first sliding contact plate 44A and the second sliding contact plate 44B are each a plate-like member and constitute front and rear walls of a printing space 45 as viewed in the squeegeeing direction. In such a state that the closed type squeegee mechanism 13 is lowered, the first sliding contact plate 44A and the second sliding contact plate 44B are in abutment with the surface of the screen mask 12 at their lower end portions.

In screen printing, the paste P within the cartridge 41 is pressurized by the pressurizing plate 42, and the paste P is then forcibly passed through the screen plate 41a reaches the space defined below the main body portion 40, that is, the printing space 45 surrounded by the first sliding contact plate 44A, the second sliding contact plate 44B and a lower surface of the main body portion 40. Then, the closed type squeegee mechanism 13 with the paste P filled in the printing space 45 is caused to slide on the screen mask 12. By doing so, the paste P within the printing space 45 is filled in the depressed portions 12e of the fitting portions 12c or the patterned holes 12f of the screen mask 12 via a printing opening which is provided between the first sliding contact plate 44A and the second sliding contact plate 44B.

Then, the paste P is filled sequentially in the patterned holes 12f by moving the closed type squeegee mechanism 13. Namely, the closed type squeegee mechanism 13 has a function to fill the paste P in the recess portions 12e of the fitting portions 12d or the patterned holes 12f of the screen mask 12 via the printing opening formed between the first sliding contact plate 44A and the second sliding contact plate 44B by allowing to slide in the squeegeeing direction with the first sliding contact plate 44A and the second sliding contact plate 44B brought into abutment with either the bottom surface printing region 12a or the upper surface of the upper surface printing region 12b while pressurizing the paste P stored in the main body portion 40.

Here, functions of the first sliding contact plate 44A and the second sliding contact plate 44B which are required in this embodiment differ, and materials and thicknesses of the first sling contact plate 44A and the second sliding contact plate 44B differ by function. Namely, in a squeegeeing operation on the bottom surface printing areas 5e under the bottom surface printing region 12a as a printing target, the first sliding contact plate 44A is put in a positional relationship in which the first sliding contact plate 44A is positioned at a rear side in a squeegeeing direction for the purpose of scooping up extra paste remaining within the depressed portions 12e in the upper surfaces of the fitting portions 12c in this squeegeeing operation to thereby remove it from the depressed portions 12e.

Because of this, a material which is rich in flexibility, for example, a resin material such as a urethane resin is selected for the first sliding contact plate 44A so that the lower end portion of the first sliding contact plate 44A enters the depressed portions 12e so as to function to scrape off the paste when the first sliding contact plate 44A passes through the depressed portions 12e while it is sliding on the screen mask 12. In addition to the selection of the material, a thickness dimension of the first sliding contact plate 44A is set suitably so that the first sliding contact plate 44A deforms in a desired deflected form by an impression pressure with which the main body portion 40 is pressed against the screen mask 12. By selecting suitably the material which is rich in flexibility and selecting suitably the thickness dimension in the way described above, the first sliding contact plate 44A is permitted to be deformed not only in the direction in which it extends obliquely downwards but also in a longitudinal direction (the X direction). By this configuration, when the first sliding contact plate 44A passes through the depressed portions 12e, the lower end portion of the first sliding contact plate 44A enters the depressed portions 12e within a widthwise range which corresponds to the range in the X direction of the depressed portion 12e.

In contrast to this, in a squeegeeing operation on the upper surface 5a under the upper surface printing region 12b as a printing target, the second sliding contact plate 44B is put in a positional relationship in which the second sliding contact plate 44B is positioned at a rear side in a squeegeeing direction for the purpose of scraping off extra paste sticking to an upper surface 12g of the upper surface printing region 12b in an ensured fashion. Because of this, a material which has large rigidity, for example, a metallic material such as a stainless steel is selected for the second sliding contact plate 44B so that the lower end portion of the second sliding contact plate 44B is pressed against the lower surface 12g so as to be closely attached thereto when the second sliding contact plate 44B slides on the screen mask 12. In addition to the selection of the material, a thickness dimension of the second sliding contact plate 44B is set suitably so that the second sliding contact plate 44B deforms in a desired deflected form by an impression pressure with which the main body portion 40 is pressed against the screen mask 12.

Figure 6:
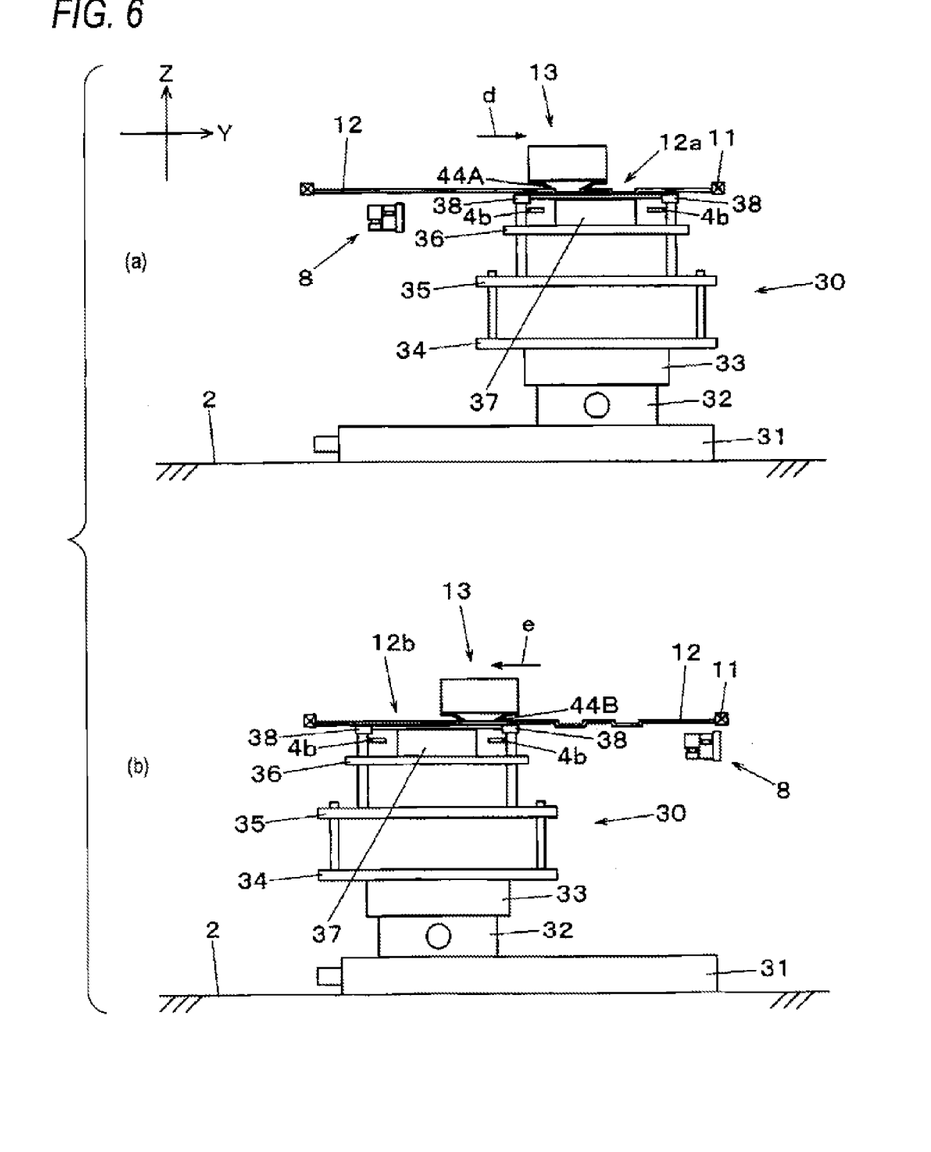
Figure 7:
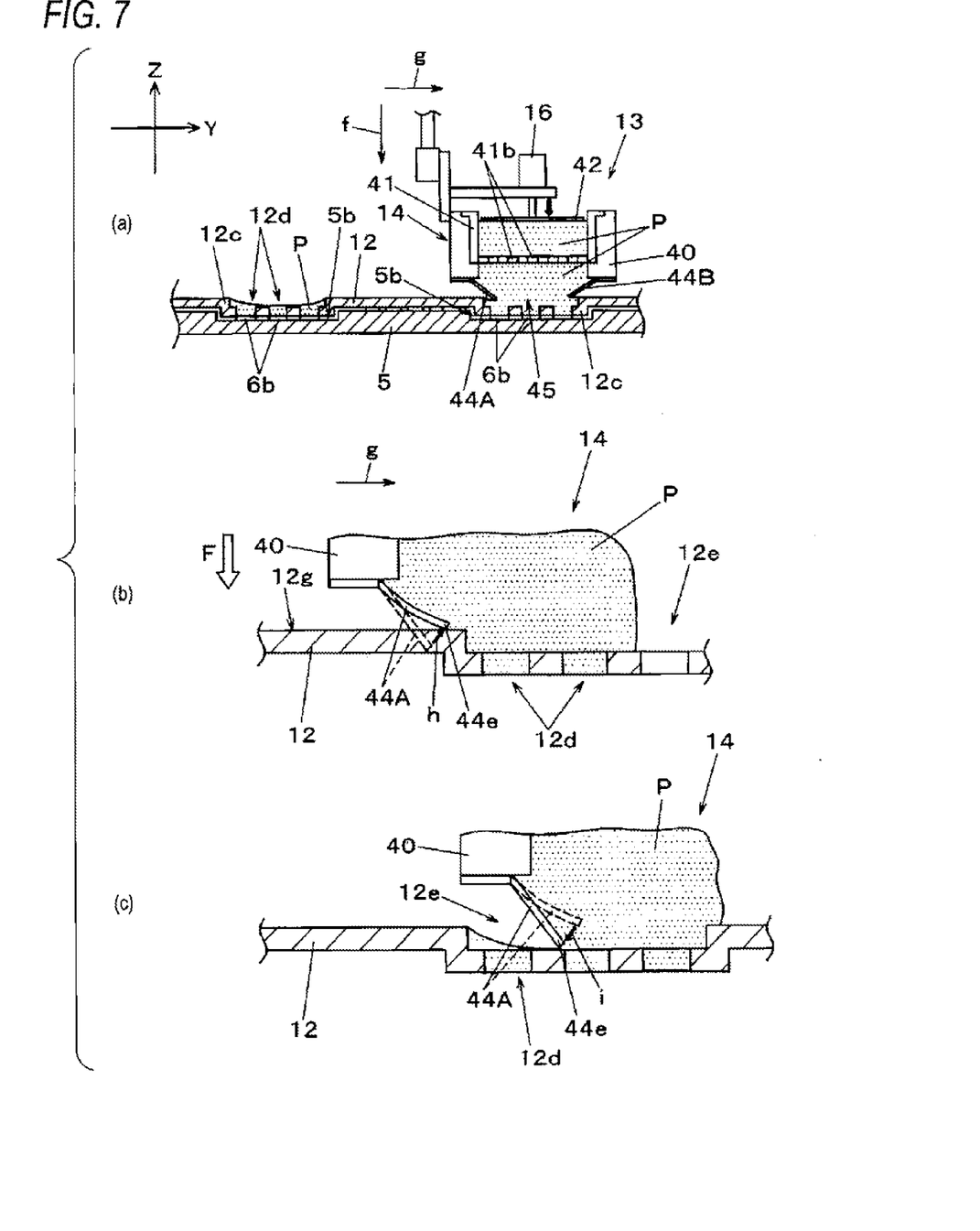
Figure 8:
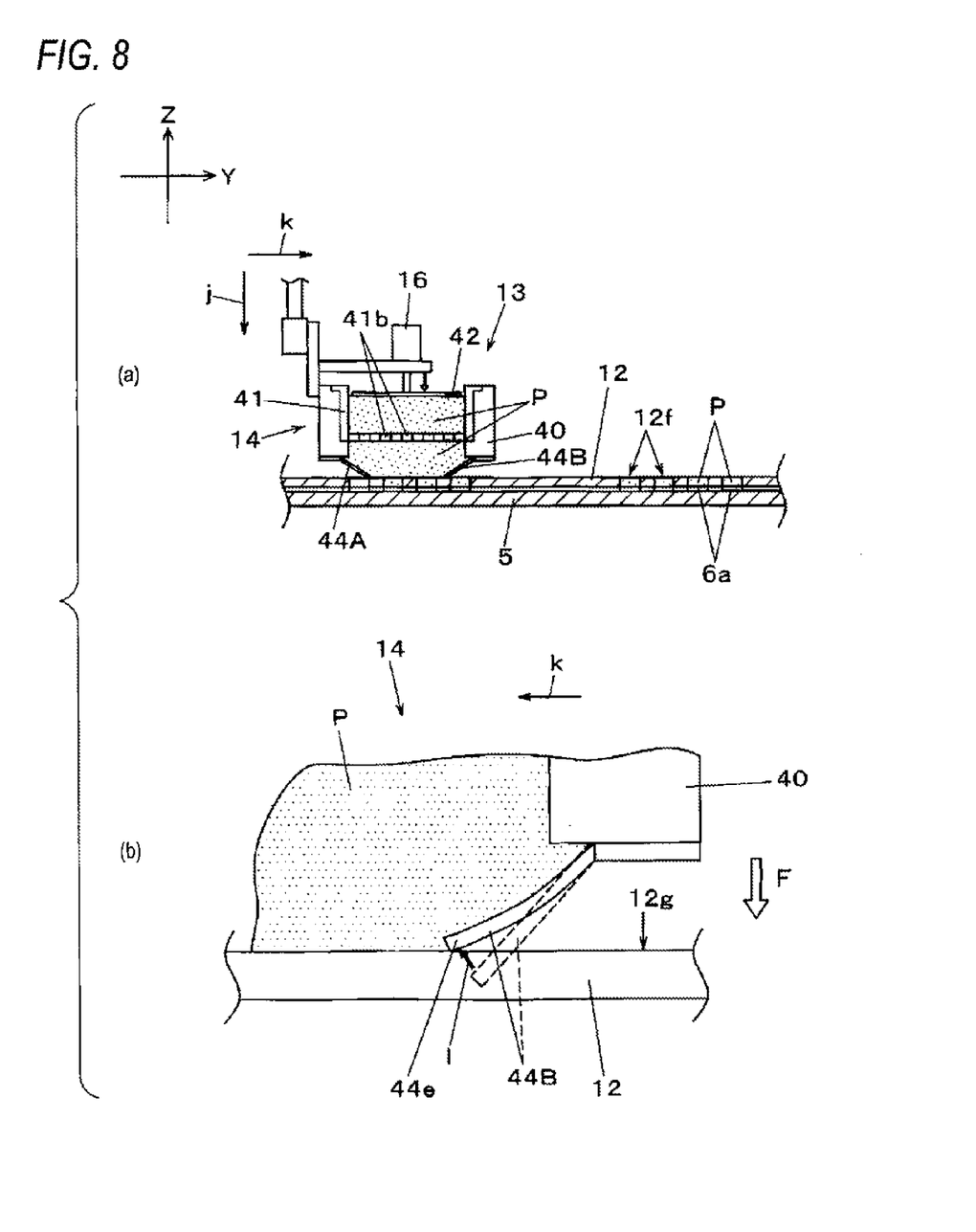

In the screen printing on the substrate 5 as a printing target by the screen printing apparatus 1, the substrate 5 is sequentially registered with the bottom surface printing region 12a and the upper surface printing region 12b of the screen mask 12 and the paste P is printed thereon by the closed type squeegee mechanism 13. The screen printing on these two printing regions will be described by reference to FIGS. 6, 7 and 8. Firstly, FIG. 6(a) shows a printing operation on the bottom surface printing region 12a as a printing target. In this case, the substrate positioning unit 30 is registered with a lower surface side of the bottom surface printing region 12a, and the substrate 5 which is supported by the lower support member 37 from therebelow is brought into abutment with the screen mask 12 from the lower surface side thereof.

By doing so, as is shown in FIG. 7(a), the fitting portions 12c of the screen mask 12 fit in the recess portions 5b of the substrate 5. Then, in this state, the closed type squeegee mechanism 13 is lowered (an arrow f), and the first sliding contact plate 44A and the second sliding contact pate 44B are brought into abutment with the screen mask 12. Following this, the closed type squeegee mechanism 13 is moved in a squeegeeing direction (an arrow g). As this occurs, the moving direction of the closed type squeegee mechanism 13 is set so that the first sliding contact plate 44A is positioned at the rear side in the squeegeeing direction.

FIGS. 7(b), (c) show behaviors of the first sliding contact plate 44A when it passes through the depressed portion 12e. Namely, a deflection is generated in the first sliding contact plate 44A (an arrow h) by the man body portion 40 being pressed against the screen mask 12 by the impression pressure F, and the printing unit 14 performs a squeegeeing operation in this state. Then, when the printing unit 14 travels and the first sliding contact plate 44A moves into the depressed portion 12e, since the first sliding contact plate 44A is made of the material which is rich in flexibility, as is shown in FIG. 7(c), the lower end portion 44e is deformed in a direction in which it enters the depressed portion 12e from a state shown in FIG. 7(b) by virtue of a spring-back force generated by deflected deformation. By this deformation, the paste P remaining in the depressed portion 12e is scooped up by the first sliding contact plate 44A to thereby be removed therefrom. Namely, in this embodiment, the material and thickness of the first sliding contact plate 44A are selected so that the first sliding contact plate 44A is deflected to be deformed by the impression pressure which presses the closed type squeegee mechanism 13 against the upper surface of the bottom surface printing region 12a in the squeegeeing operation and the lower end portion 44e enters the depressed portion 12e by virtue of the spring-back force of the deflected deformation.

Next, FIG. 6(b) shows a printing operation on the upper surface printing region 12b as a printing target. In this case, the substrate positioning unit 30 is registered with a lower surface side of the upper surface printing region 12b, and the substrate 5 which is supported by the lower support member 37 from therebelow is brought into abutment with the screen mask 12 from the lower surface side thereof. As a result of the abutment of the substrate 5 with the screen mask 12, as is shown in FIG. 8(a), the depressed portions 12e in the screen mask 12 are registered with the upper surface electrodes 6a on the substrate 5. Then, in this state, the closed type squeegee mechanism 13 is lowered (an arrow j), and the first sliding contact plate 44A and the second sliding contact pate 44B are brought into abutment with the screen mask 12. Following this, the closed type squeegee mechanism 13 is moved in a squeegeeing direction (an arrow k). As this occurs, the moving direction of the closed type squeegee mechanism 13 is set so that the second sliding contact plate 44B is positioned at the rear side in the squeegeeing direction.

FIG. 8(b) shows a behavior of the second sliding contact plate 44B when it slides over the upper surface 12g of the screen mask 12. Namely, a deflection is generated in the second sliding contact plate 44B (an arrow I) by the man body portion 40 being pressed against the screen mask 12 by the impression pressure F, and the printing unit 14 performs a squeegeeing operation in this state. Then, when the printing unit 14 travels to continue squeegeeing, since the second sliding contact plate 44B is made of the material which has rigidity, the is lower end portion 44e of the second sliding contact plate 44B is pressed against the upper surface 12g by virtue of a reaction force resulting from deflection which corresponds to the impression pressure F, whereby the lower end portion 44e is closely attached to the upper surface 12g. By this deformation, the paste P remaining in the depressed portion 12e is scooped up by the first sliding contact plate 44A to thereby be removed therefrom. Namely, in this embodiment, the material and thickness of the first sliding contact plate 44A are selected so that the first sliding contact plate 44A is deflected to be deformed by the impression pressure which presses the closed type squeegee mechanism 13 against the upper surface of the bottom surface printing region 12a in the squeegeeing operation and the lower end portion 44e enters the depressed portion 12e by virtue of the spring-back force of the deflected deformation.

By the close attachment of the lower end portion 44e to the upper surface 12g, the paste P sticking to the upper surface 12g is separated and scraped off the upper surface 12g by the second sliding contact plate 44B. Namely, in this embodiment, the thickness and material of the second sliding contact plate 44B are selected so that in the squeegeeing operation, the lower end portion 44e of the second sliding contact plate 44B is closely attached to the upper surface 12g by the impression pressure with which the closed type squeegee mechanism 13 is pressed against the upper surface 12g of the upper surface printing region 12b and the paste P sticking to the upper surface 12g is separated and scraped off the upper surface 12g.

In this way, in the screen printing method for printing the electronic part joining paste on the upper surface printing areas which are set on the upper surface of the substrate and on which the upper surface electrodes are formed and the bottom surface printing areas which are set on the bottom surfaces of the recess portions which are opened to the upper surface as printing targets, in the squeegeeing operation on the bottom surface printing region 12a as a printing target, the paste P remaining in the depressed portions 12e on the upper surface side of the fitting portions 12c is scooped up by the first sliding contact plate 44A of the pair of siding contact plates of the closed type squeegee mechanism 13 which lies at the rear side in the squeegeeing direction in the squeegeeing operation so as to remove the paste P from the depressed portions 12e. In addition, in the squeegeeing operation on the upper surface printing region 12b as a printing target, the paste P sticking to the upper surface of the upper surface printing region 12b is scraped off by the second sliding contact plate 44B of the pair of sliding contact plates of the closed type squeegee mechanism 13 which lies at the rear side in the to squeegeeing direction in the squeegeeing operation.

By adopting the screen printing method like this, the various limitations and problems which are inherent in the conventional screen printing on such a printing target as a cavity substrate are solved, and in the screen printing on such printing targets as the upper surface of the substrate and the bottom surfaces of the recess portions which are opened to the upper surface, printing work can be executed with good efficiency while ensuring the good printing quality.

This patent application is based on Japanese Patent Application (No. 2009-164744) filed on Jul. 13, 2009, the entire contents of which are incorporated herein by reference.

INDUSTRIAL APPLICABILITY

The screen printing apparatus and the screen printing method of the invention have the advantage that the printing work can be executed with good efficiency while ensuring the good printing quality in the screen printing on such printing targets as the upper surface of the substrate and the bottom surfaces of the recess portions which are opened to the upper surface and are effective in a field in which an electronic part joining paste is printed on such a printing target as a cavity substrate in which printing areas differ in height.

DESCRIPTION OF REFERENCE NUMERALS 1 screen printing apparatus; 2 base; 3 screen printing unit; 4, substrate transfer mechanism; 5 substrate; 5b recess portion; 5e bottom surface printing area; 6a upper surface electrode; 6b bottom surface electrode; 12 screen mask; 12a bottom surface printing region; 12b upper surface printing region; 12c fitting portion; 12d patterned hole; 12e depressed portion; 13 close type squeegee mechanism; 14 printing unit; 20 squeegee moving mechanism; 30 substrate positioning unit; 44A first sliding contact plate; 44B second sliding contact plate.

The invention claimed is:

1. A screen printing apparatus for printing an electronic part joining paste on printing targets as an upper surface printing area which is set on an upper surface of a substrate and on which upper surface electrodes are formed and a bottom surface printing area which is set on a bottom surface of a recess portion which is opened to the upper surface and on which bottom surface electrodes are formed, the screen printing apparatus comprising:

a screen mask including a bottom surface printing region which has a fitting portion which is provided so as to correspond to the bottom surface printing area and which fits in the recess portion and patterned holes which are formed in the fitting portion so as to correspond to the bottom electrodes and an upper surface printing region which is provided so as to correspond to the upper surface printing area and patterned holes which are formed so as to correspond to the upper surface electrodes;

a substrate positioning unit which holds a substrate which is transferred from an upstream side and selectively registers the substrate with either the bottom surface printing region or the upper surface printing region; and a closed type squeegee mechanism which has a pair of facing sliding contact plates which extend downwards from a lower surface side of a main body portion which stores the paste so as to gradually narrow a distance between the facing sliding contact plates as the facing sliding contact plates extend downwards with their facing direction aligned with a squeegeeing direction and which is adapted to slide in the squeegeeing direction with the sliding contact plates brought into abutment with either the bottom surface printing region or an upper surface of the upper surface printing region while pressurizing the paste stored in the main body portion so that the paste is supplied into the fitting portion or is filled in the patterned holes via a printing opening provided between the sliding contact plates, and wherein, among the pair of sliding contact plates of the closed type squeegee mechanism, a first sliding contact plate which is positioned at a rear side in a squeegeeing direction in a squeegeeing operation on the bottom surface printing region as a printing target scoops up the paste which remains in an upper surface side depressed portion of the fitting portion so as to remove it from the depressed portion in the squeegeeing operation, while a second sliding contact plate which is positioned at a rear side in a squeegeeing direction in a squeegeeing operation on the upper surface printing region as a printing target scrapes off the paste sticking to the upper surface of an upper surface of the upper surface printing mask in the squeegeeing operation, wherein the first sliding contact plate and the second sliding contact plate have different materials and thicknesses with each other, wherein a thickness and material of the first sliding contact plate are selected so that the first sliding contact plate is deflected to be deformed by an impression pressure with which the closed type squeegee mechanism is pressed against an upper surface of the bottom surface printing region in the squeegeeing operation and a lower end portion thereof enters the depressed portion by virtue of a spring-back force resulting from the deflected deformation, wherein a thickness and material of the second sliding contact plate are selected so that a lower end portion thereof is closely attached to an upper surface of the upper surface printing region by an impression pressure with which the closed type squeegee mechanism is pressed against the upper surface in the squeegeeing operation so as to separate and scrape the sticking paste off the upper surface.

2. The screen printing apparatus as set forth in claim 1, wherein the first sliding contact plate is made of a resin material, and the second sliding contact plate is made of a metallic material, and wherein the first sliding contact plate has a length sufficient to contact with the upper surface of the bottom surface printing region with deformation.

3. A screen printing method for printing an electronic part joining paste on printing targets as an upper surface printing area which is set on an upper surface of a substrate and on which upper surface electrodes are formed and a bottom surface printing area which is set on a bottom surface of a recess portion which is opened to the upper surface and on which bottom surface electrodes are formed, the screen printing method comprising:

employing a screen printing apparatus comprising a screen mask including a bottom surface printing region which has a fitting portion which is provided so as to correspond to the bottom surface printing area and which fits in the recess portion and patterned holes which are formed in the fitting portion so as to correspond to the bottom electrodes and an upper surface printing region which is provided so as to correspond to the upper surface printing area and patterned holes which are formed so as to correspond to the upper surface electrodes, a substrate positioning unit which holds a substrate which is transferred from an upstream side and selectively registers the substrate with either the bottom surface printing region or the upper surface printing region, and a closed type squeegee mechanism which has a pair of facing sliding contact plates which extend downwards from a lower surface side of a main body portion which stores the paste so as to gradually narrow a distance between the facing sliding contact plates as the facing sliding contact plates extend downwards with their facing direction aligned with a squeegeeing direction and which is adapted to slide in a squeegeeing direction with the sliding contact plates brought into abutment with either the bottom surface printing region or an upper surface of the upper surface printing region while pressurizing the paste stored in the main body portion so that the paste is supplied into the fitting portion or is filled in the patterned holes via a printing opening provided between the sliding contact plates;

wherein, in a squeegeeing operation on the bottom surface printing region as a printing target, the paste which remains in an upper surface side depressed portion of the fitting portion is scooped up by a first sliding contact plate of the pair of sliding contact plates of the closed type squeegee mechanism which is positioned at a rear side in a squeegeeing direction in the squeegeeing operation so as to be removed from the depressed portion, while in a squeegeeing operation on the upper surface printing region as a printing target, the paste sticking to an upper surface of the upper surface printing mask is scraped off by a second sliding contact plate of the pair of sliding contact plates of the closed type squeegee mechanism which is positioned at a rear side in a squeegeeing direction in the squeegeeing operation, wherein the first sliding contact plate and the second sliding contact plate have different materials and thicknesses with each other.

4. The screen printing method as set forth in claim 3, wherein the first sliding contact plate is made of a resin material, and the second sliding contact plate is made of a metallic material, and wherein the first sliding contact plate has a length sufficient to contact with the upper surface of the bottom surface printing region with deformation.

* * * * *